United States Patent [19]

Vassos

[11] 4,179,644

[45] Dec. 18, 1979

[54] POWER TOOL SWITCH INCLUDING SPEED CONTROL

[75] Inventor: Louis J. Vassos, Park Ridge, Ill.

[73] Assignee: Skil Corporation, Chicago, Ill.

[21] Appl. No.: 868,269

[22] Filed: Jan. 10, 1978

[51] Int. Cl.[2] .......... H05K 7/14

[52] U.S. Cl. .......... 318/17; 310/50; 200/145; 318/345 R

[58] Field of Search .......... 200/145; 310/50; 318/345 G, 345 R, 17; 361/386

[56] References Cited

U.S. PATENT DOCUMENTS

| | | | |
|---|---|---|---|
| 2,279,753 | 4/1942 | Knopp | 200/145 R |
| 3,372,288 | 3/1968 | Wigington | 200/145 R |
| 3,439,248 | 4/1969 | Winchester | 310/50 |
| 3,447,057 | 5/1969 | Brown et al. | 310/50 |
| 3,563,973 | 10/1970 | Mathews | 318/345 G |
| 3,648,142 | 3/1972 | Corey et al. | 310/50 |
| 3,721,879 | 3/1973 | Corey et al. | 310/50 |
| 3,761,788 | 9/1973 | Matthews | 310/50 |

*Primary Examiner*—David Smith, Jr.
*Attorney, Agent, or Firm*—McDougall, Hersh & Scott

[57] ABSTRACT

A double pole, trigger actuated switch employs a bridge contact and a separate contactor for opening and closing both lines from a source of current to an associated power tool. The bridge contact is always closed first and opened last with respect to the contactor so that the former is not subjected to arcing and may be made smaller and less expensively than the latter. The contactor is of the fast closing type constructed to minimize arcing. A speed control circuit is associated with the contactor. The entire switch, including the speed control circuit, is provided in a compact housing for mounting in small portable hand tools such as electric drills. A heat sink is exposed to the ambient air by virtue of louvers in the switch housing.

14 Claims, 10 Drawing Figures

POWER TOOL SWITCH INCLUDING SPEED CONTROL

BACKGROUND OF THE INVENTION

This invention relates to control circuits for electrical appliances. More specifically, the invention relates to switches for use with power tools, such as electric drills, jigsaws and the like. For such applications it is necessary to provide a switch which is highly reliable, durable and yet compact and low in cost. For heavy duty power tools, such switches must handle high currents (on the order of four to six amps or more) during operation. Accordingly, arcing is a problem because of these high current loads. Thus, the contacts must be designed to minimize arcing but yet have sufficient surface area to insure good electrical contact over extended service periods. These requirements are difficult to achieve in view of the necessity for manufacturing such a switch as inexpensively as possible.

In many applications it is additionally desirable that the switch include circuit means for controlling the speed of the tool operation as, for example, the revolutions per minute of a drill.

PRIOR ART STATEMENT

The closest prior art patents of which applicant is aware are: U.S. Pat. No. 3,536,973 to Matthews et al relating to a switch and speed control which employs a snap action contact member 60 (FIG. 7) and which, in FIG. 14, discloses a two pole switch utilized in conjunction with a speed control wherein the switches for each pole are substantially identical and close at substantially the same time; U.S. Pat. No. 3,209,228 to Gawron which discloses a speed control circuit; U.S. Pat. No. 3,543,120 to Robertson which discloses a speed control mounted on a circuit board of the type utilized in the present invention; U.S. Pat. No. 3,594,523 to Frenzel which discloses a snap action contact 25 and a speed control; German Pat. No. 2,024,892 which discloses a two pole switch employing contacts 9 and 10 of a type similar to the contactor of the present invention; and U.S. Pat. No. 3,401,241 to Frenzel which discloses sequential opening and closing of a two pole switch.

These prior art devices are not as compact as is desirable nor in certain other respects are they as satisfactory as desired. Further, they do not achieve the objects of the present invention as set forth hereafter.

It is an object of the present invention to provide an improved two pole switch including a speed control which is small in size, low in cost and highly resistant to failure by arcing.

Another object of the invention is to provide a two pole switch in which one of the two sets of contacts is opened and closed only during the portion of the operating cycle when no current is flowing through the one set of contacts thereby permitting the same to be smaller in size and produced less expensively than the other set of contacts.

A further object of the invention is to provide a two pole switch according to the foregoing object in which the other set of contacts is of the fast closing type to substantially reduce arcing.

Another object of the invention is to provide a two pole switch in which only one set of contacts is subjected to the possibility of arcing, these contacts being significantly larger in contact area than the other set of contacts.

Yet another object of the invention is to provide a switch of the type described in association with a miniaturized solid state speed control circuit capable of handling relatively large currents by use of a heat sink wholly contained within the switch housing and vented to the ambient air.

Other objects and advantages of the invention will be apparent from the remaining portion of the specification.

DETAILED DESCRIPTION

Figure 1:
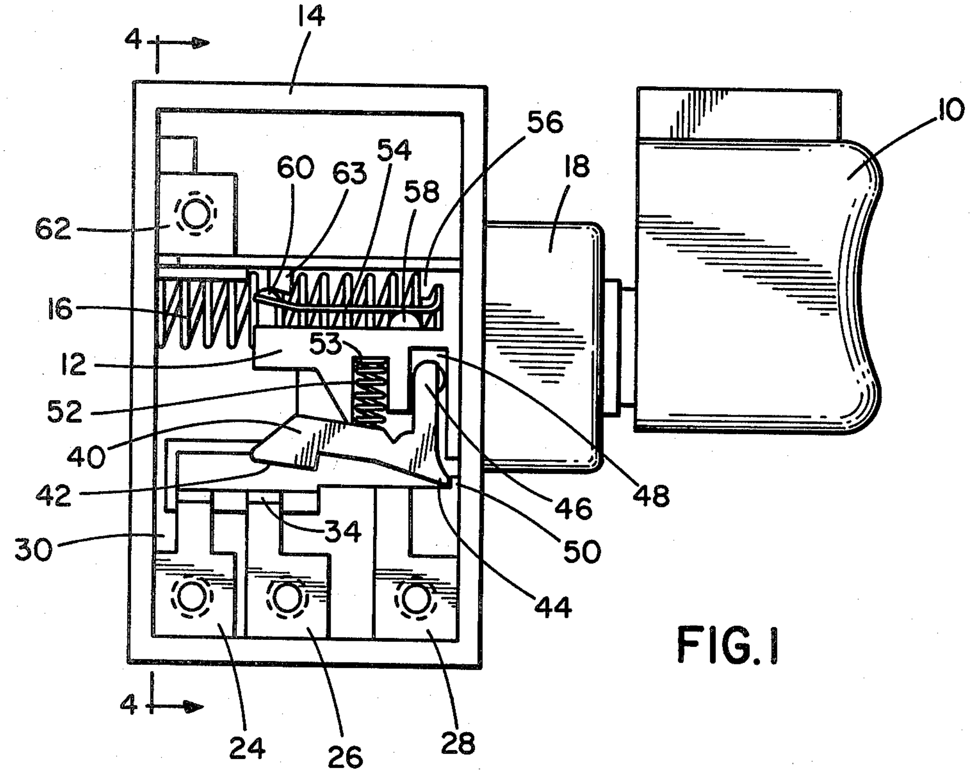
FIG. 1 is a side elevation of a switch according to the invention and shown in the "off" position.

Referring to FIG. 1, a switch according to the present invention is illustrated. The switch functions to connect the motor of a power tool, such as an electric drill, to an AC voltage source. The switch is a two pole device interrupting current flow to both sides of the motor when in the off position illustrated in FIG. 1. The switch is provided in a housing 14 which is suitably formed in two halves. The housing is provided with a number of compartments and openings to receive the component parts of the switch and the wires which are electrically connected thereto. Depending upon the type of tool the housing may contain a speed control circuit and/or a reversing switch in addition to the switch according to the present invention.

The switch includes a trigger 10 having a shaft 12 mounted in the housing for reciprocal movement against the bias of a spring 16. The shaft 12 moves to the left, as viewed in FIG. 1, responsive to manual pressure on the trigger. The shaft passes through the housing 14 to join the trigger via an opening in the housing which is covered by a flexible dust boot 18.

A speed control module 30 is provided in the housing positioned beneath the shaft 12. The module is secured to the housing by tabs 32 (FIG. 6) provided on both ends of the module which are adapted to engage similarly dimensioned openings in the housing 14.

Figure 6:
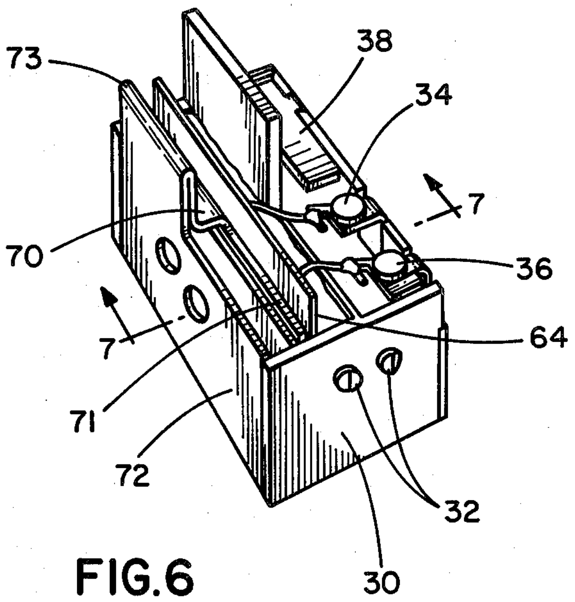
FIG. 6 is an isometric view of the speed control module and portions of the switch.

As best seen in FIGS. 1 and 6, the module 30 is provided with contact means on one side thereof extending onto the top of the module. These contact means include contact terminals 24, 26 and 28. These terminals are adapted to receive a screw through a central opening for securing a wire to the terminal. The portion of the terminals extending over the top of the module terminate in contact rivets 34 and 36 in the case of terminals 24 and 26 and bar contact 38 in the case of terminal 28. Contact rivets 34 and 36 are relatively large in diameter thereby to provide a large contact face to insure trouble free switching.

A contactor means 40 is provided for connecting terminal 28 to terminal 26. The contactor means, preferably of the type shown in Frenzel U.S. Pat. No. 3,594,523, is generally L-shaped and includes a pair of spaced contact faces 42 and 44 and an upstanding formation in the nature of an ear 46. Contact face 44 remains in engagement with bar contact 38 at all times. In the unactuated or off position, contact face 44 is held against a lip 50 provided on the end of the bar contact. Contact face 42 is positioned over the contact rivet 34 associated with terminal 26. A spring 52 is provided in a recess 53 of the trigger shaft for exerting a downward force on the contactor 40, however, in the off position. The contact face 42 is held in spaced relationship with the rivet 34 by the action of the spring 16 which cams or rocks the contactor 40 about the fulcrum defined by the contact face 44, all as described in the aforementioned Frenzel patent.

Figure 2:
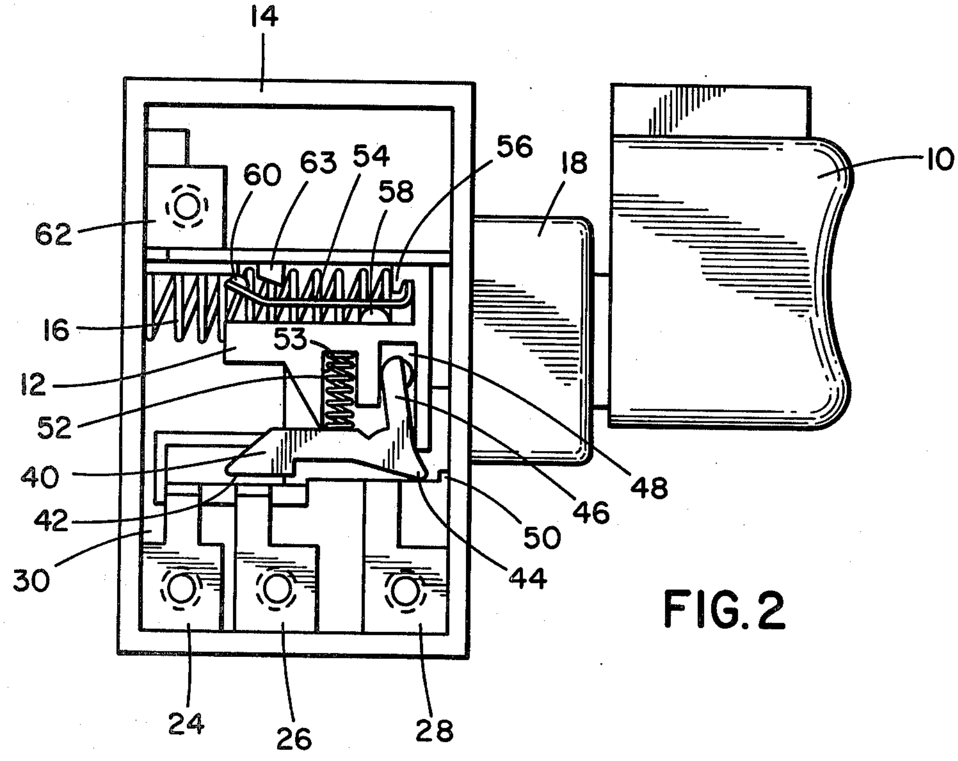
FIG. 2 is a view similar to FIG. 1 with the switch shown in a partially actuated position wherein the bridge contacts are closed and the contactor controls are open to prevent a complete circuit.
Figure 3:
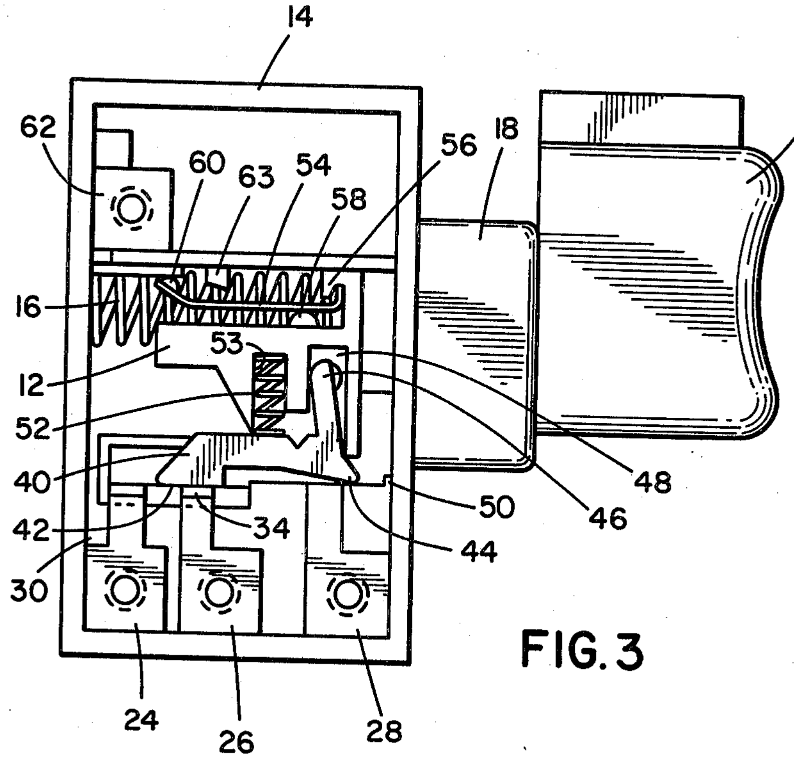
FIG. 3 is a view similar to FIG. 1 in which the switch is in an actuated or "on" position permitting current flow from the source to the tool through the speed control circuit.

As indicated in FIGS. 2 and 3, upon movement of the trigger to the left, the contactor 40 is rocked to cause rapid downward movement of face 42 into engagement with contact rivet 34 thereby to complete one pole of the circuit. This rapid action of the contactor 40 minimizes arcing during switching.

Figure 4:
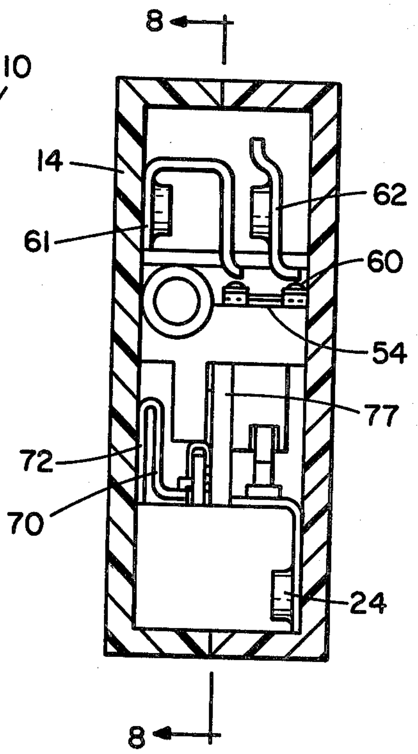
FIG. 4 is a sectional view along the lines 4—4 of FIG. 1.

The second pole of the circuit is completed by a contacting means, preferably in the form of a bridge contact 54 having an upturned end captured within a cavity in the trigger shaft by elements 56 and 58. The bridge contact is generally U-shaped (FIG. 4A); the legs or ends have contact rivets 60 provided thereon for electrically connecting a pair of terminals 61 and 62 (FIG. 4). As can be seen by reference to FIGS. 4A and 6, contact rivets 60 for the bridge contact are considerably smaller in size than the rivets 34 and 36 associated with terminals 24 and 26.

In practice, the rivets 34 and 36 may have a contact face approximately twice as large as the contact face of the bridge contact rivets. This is permissible in spite of the relatively high current for which the switch is designed (4 to 6 amps) because bridge contact 54 is arranged to close first and open last with respect to the contactor 40. Thus, during operation of the switch, no current is flowing when the bridge contact opens or closes. Under these conditions there is no possibility of arcing and thus the contact rivets 60 may be considerably smaller and less expensive.

Figure 4A:
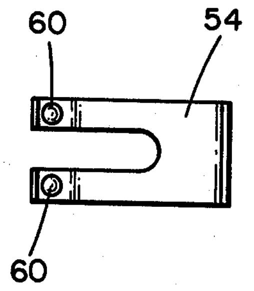
FIG. 4A is a plan view of the bridging contact.

The bridge contact illustrated in FIG. 4A is preferred; however, it will be appreciated by those skilled in the art that other shapes and arrangements can be utilized and still achieve a principal object of the present invention, viz., that contact 54 makes and breaks contact under zero current conditions. Exemplary of alternatives which are contemplated is a connecting means which is permanently secured to one of terminals 61 and 62 and merely engages the remaining terminal upon movement of the trigger. Such a configuration would require only one contact rivet 60.

In order to insure that contact rivets 60 do not touch terminals 61 and 62 in the off position, the housing may be provided with a downwardly extending tab 63 for camming the rivets away from the terminals.

With reference to FIG. 2, the switch operation will be explained. As the trigger 10 is actuated, i.e., moved from its extended position to its depressed position, the bridge contact 54 clears the tab or protrusion 63 and rivets 60 connect terminal 61 to terminal 62 thus completing one leg or pole of the circuit. As clearly illustrated in FIG. 2, contactor 40 has begun to move to the actuated position, but the contact face 42 is still spaced from the contact rivet 34 thereby to maintain the second leg of the circuit open. Note that as the contact face 42 moves toward contact rivet 34, contact face 44 moves away from the tab 50 remaining in contact, however, with bar contact 38.

As indicated in FIG. 3, additional movement of the trigger permits the contactor face 42 to snap into engagement with the rivet 34 to connect terminal 28 to terminal 26. This turns the tool on. Releasing the trigger reverses the steps described and stops the tool.

Figure 8:
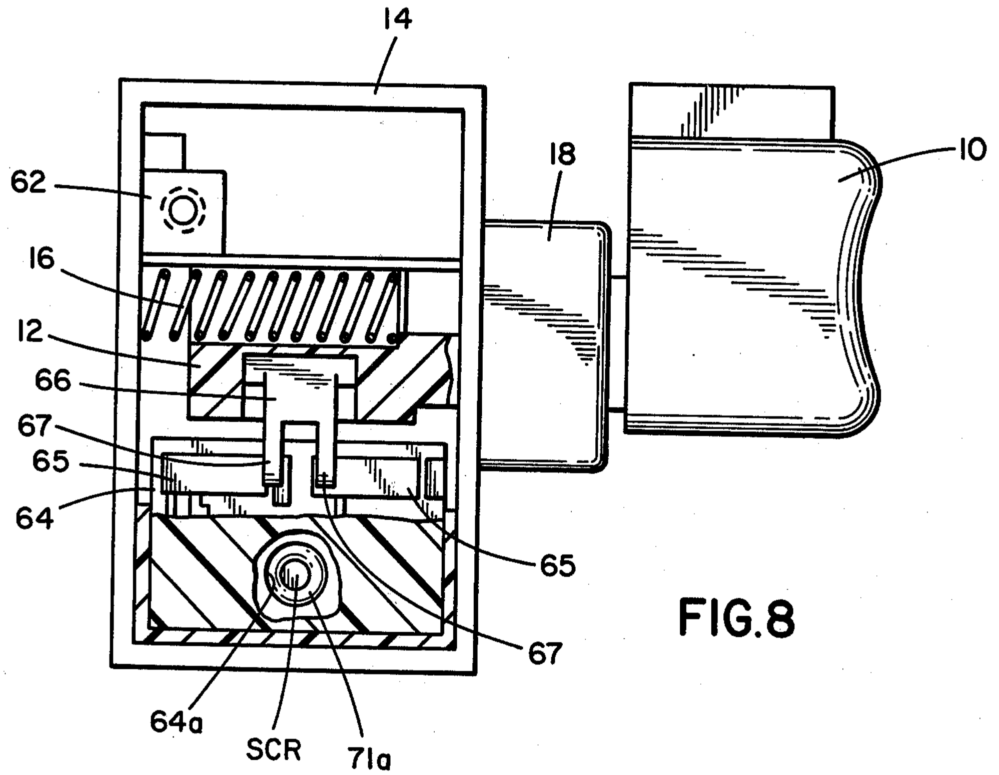
FIG. 8 is a sectional view through the module along the lines 8—8 of FIG. 4 and illustrates the sliding contacts carried by the trigger shaft.

Referring to FIGS. 6 and 8, the speed control circuit may be provided on a ceramic circuit board 64 positioned vertically and received within a cavity 31 in the module 30. Resistance strips 65 are located near the top on one side of the circuit board. The trigger shaft 12 carries a slider contact or wiper 66 having legs 67 depending downwardly therefrom to a position of engagement with resistances 65 on the circuit board. As the trigger 10 is moved relative to the circuit board, the wiper legs 67 travel across the resistances 65 producing a resistance value proportional to trigger movement for use by the speed control circuit.

The speed control circuit is preferably of the type disclosed in U.S. Pat. No. 3,543,120, which patent is hereby incorporated by reference. In the present invention, speed control is achieved when contactor 40, responsive to trigger movement, connects terminal 26 to terminal 28 thereby completing a circuit to the power tool through the speed control unit. The selected speed is determined by the resistance value of resistors 65 which, as indicated, changes as a function of trigger movement. To operate at full speed, the speed control circuit is bypassed. This is accomplished when contactor 40 is positioned, by movement of the trigger shaft, to connect terminal 28 to terminal 24 rather than terminal 26.

The speed control includes a silicon controlled rectifier (SCR) as the active device for controlling the speed of the power tool. The point at which the SCR turns on during the AC voltage cycle is determined by an RC circuit operatively connected to the control gate of the SCR. The resistance value for the RC circuit is derived from resistances 65.

The speed control circuit heretofore described produces a considerable amount of heat, particularly during low speed operation. In order to dissipate this heat, a unique heat sink, generally designated 70, is provided.

Figure 7:
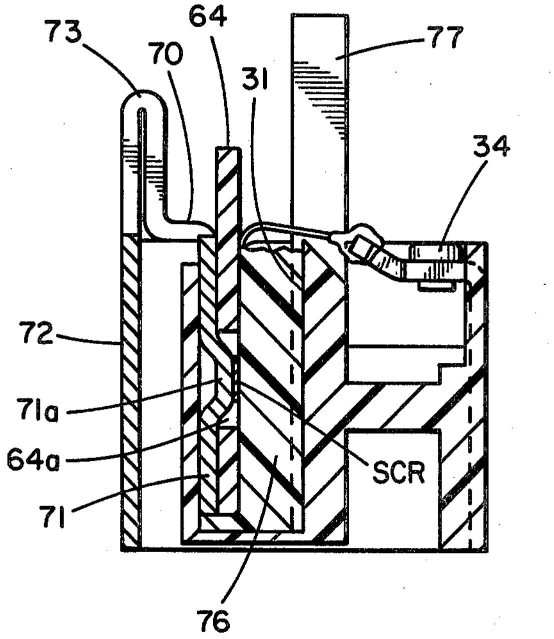
FIG. 7 is a sectional view through the module along the lines 7—7 of FIG. 6.

Referring to FIGS. 6 and 7, the heat sink has a first planar portion 71 which is in intimate contact with the ceramic circuit board 64. The various circuit elements of the speed control circuit are printed or secured on the right-face of the circuit board, as seen in FIG. 7. The ceramic circuit board is provided with an opening 64*a*. The planar portion of the heat sink 71 has a raised platform 71*a* which protrudes through the hole 64*a* and is in the same plane as the circuit board. The SCR is mounted directly on the platform 71*a*.

The heat sink 70 includes another planar portion or fin 72 in parallel spaced relationship with the planar portion 71; these two planar portions of the heat sink are joined together by an integral portion 73 doubled upon itself, as seen in FIGS. 6 and 7. The speed control module 30 is generally in the form of a parallelepiped having the various cavities and recesses to receive the components of the switch.

Figure 5:
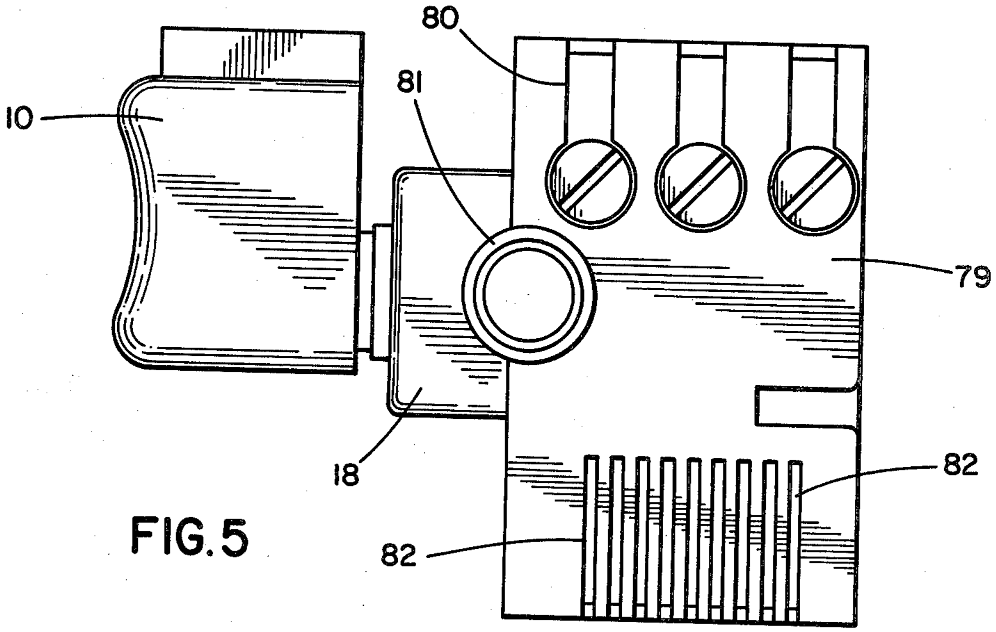
FIG. 5 is a side elevation of the switch in its housing.

Referring now to FIG. 5, the housing of the switch includes a side wall 79 having cut-outs 80 to receive screw terminals for readily connecting lead lines to the terminals 61, 62 and to a third terminal (not shown) which is used when reversing contacts are mounted in the upper portion of the switch housing. It will be understood, of course, that similar screw terminals are provided on the other side of the switch housing to connect lead lines to the terminals 24, 26, 28. As also noted in FIG. 5, the housing wall 79 mounts the usual trigger lock button 81.

The wall 79 of the switch housing is provided with a plurality of slots 82 defining louvers. When the speed control module 30 is mounted in place between the shells of the switch housing, the heat sink portion 72 is in substantial co-extensive engagement with the inner surface of the portion of the housing wall 79 containing the louvers 82. It is apparent that by this construction, a substantial portion of the heat sink is exposed to the ambient air thereby greatly facilitating the dissipation of heat generated by the speed control circuit.

As noted in FIG. 7, the ceramic circuit board 64 and the planar portion 71 of the heat sink are received within a cavity 31 formed in the speed control module. An encapsulating material 76 fills the remaining space in the cavity 31 and encapsulates the various circuit elements on the circuit board 64 with the exception, of course, of the resistance strips 65 which extend along the upper marginal portion of the circuit board for engagement with the legs 67 of the wiper 66. As noted in FIG. 6, the speed control module includes an upstanding guide 77 which is received within a recess in the shaft or stem of the trigger 10 to aid in maintaining alignment between the various fixed and movable contacts.

Figure 9:
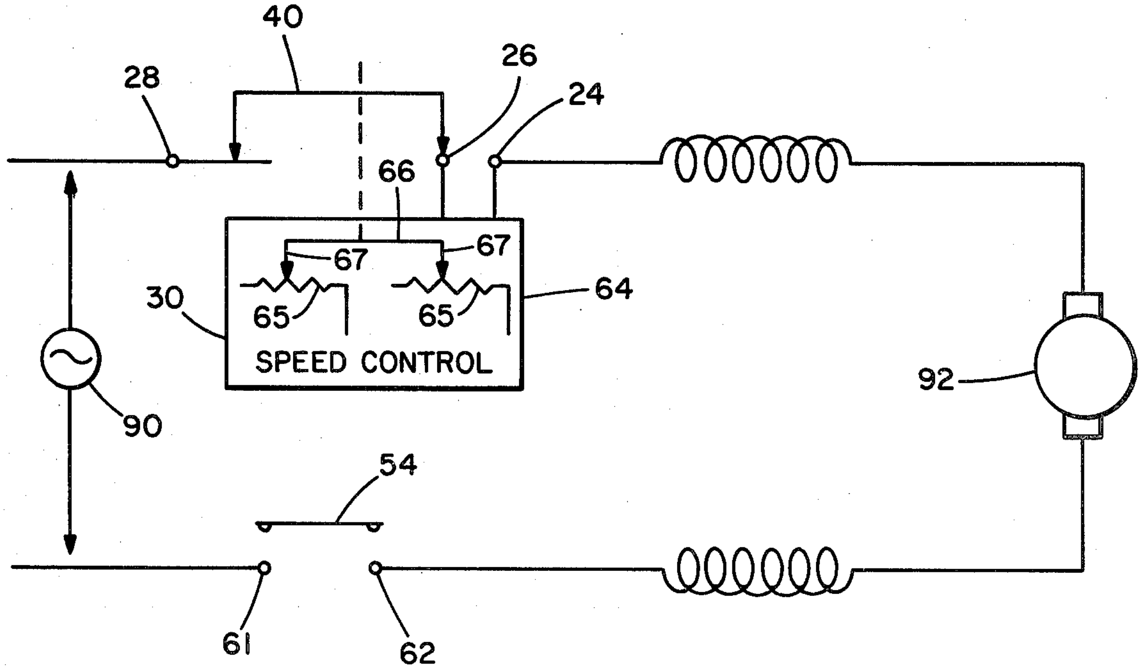
FIG. 9 is a circuit diagram of the switch and speed control circuit.

Referring now to FIG. 9, the electrical operation of the switch will be briefly described. An AC voltage source 90 is connected to the switch via terminals 28 and 61. When the trigger 10 is depressed by the tool operator, bridge contacts 54 close connecting terminals 61 and 62 thereby completing one leg of the circuit to the tool motor 92. Subsequently, contactor 40 snaps closed connecting terminal 28 to terminal 26 thereby completing the other leg of the circuit to initiate operation of the motor. Further movement of the trigger causes a change in the resistance value selected by slider contacts 67 to increase motor speed until finally the speed control is bypassed by connecting terminal 28 directly to terminal 24. Releasing the trigger reverses the sequence and stops the motor.

A point to be emphasized is that during movement of the trigger to the off position the contactor 40 opens to interrupt current flow to the motor while the bridge contact 54 is still connecting terminals 61 and 62. Only after current flow has ceased does the bridge contact break the circuit connection between these terminals.

It will be appreciated that the present invention provides a small and compact double pole switch which is readily adaptable for mounting in the casing of a portable electric tool, such as a drill or jigsaw. As is known to those skilled in the art, the handle portions of such tools are provided with spaces to receive the switch with the trigger thereof projecting through an opening in the casing to permit manipulation by the operator.

While I have shown and described embodiments of this invention in some detail, it will be understood that this description and illustrations are offered merely by way of example, and that the invention is to be limited in scope only by the appended claims.

I claim:

1. In a double pole, trigger actuated switch of the type contained within a housing and adapted for mounting within the casing of a power tool for selectively connecting and disconnecting both sides of a power source for the tool motor in response to movement of the trigger between extended and depressed positions, the improvements comprising:

(a) a first pair of contacts including a first fixed contact and an associated first movable contact for making and breaking one side of the power source for the tool motor;

(b) a second pair of contacts including a second fixed contact and an associated second movable contact for making and breaking the other side of the power source for the tool motor;

(c) means connecting said trigger with said first and second movable contacts for closing said first and second pairs of contacts sequentially such that the first pair of contacts is closed prior to closing of the second pair of contacts in response to movement of the trigger from its extended position to its depressed position and for opening said pairs of contacts in reverse order in response to movement of the trigger from its depressed position to its extended position;

(d) said connecting means including camming means for rapidly making and breaking engagement of the second pair of contacts in a snap-action manner to minimize arcing;

(e) a speed control circuit contained within the switch housing on a circuit board operatively connected to the trigger whereby the speed of the tool motor may be varied in response to the amount of trigger movement; and (f) a heat sink contained within said housing in intimate contact with said circuit board, said heat sink having a planar portion and an integral cooling fin in parallel spaced relation with said planar portion.

2. The improvement according to claim 1 wherein one of said first pair of contacts has a contact face with a surface area substantially less than the surface area of the contact face of one of said second pair of contacts.

3. The improvement according to claim 1 wherein said speed control circuit includes a variable resistor having a slider engaged with the trigger whereby the speed of a tool motor may be varied in response to the amount of movement of the trigger.

4. The improvement according to claim 1 further defined by:

(a) said speed control circuit including a controllable solid state element;

(b) said heat sink having a portion thereof adjacent said element for dissipating heat generated by the latter;

(c) said housing of the speed control switch having an opening in one of the walls thereof;

(d) said heat sink having a portion thereof in engagement with the inner surface of said wall adjacent and coextensive with said opening for exposing said heat sink to the ambient air for dissipation of heat.

5. The improvement according to claim 4 wherein said controllable solid state element is in direct physical contact with said heat sink.

6. The switch according to claim 1 wherein said cooling fin is attached to said planar portion by a connecting element which doubles back on itself to position the fin directly behind the heat sink and spaced therefrom in a plane parallel to the plane of the heat sink.

7. In a double pole, trigger actuated switch of the type contained within a housing and adapted for mounting within the casing of a power tool for selectively connecting and disconnecting both sides of a power source for the tool motor in response to movement of the trigger between extended and depressed positions, the improvement comprising:

(a) a first pair of contacts including a first fixed contact and an associated first movable contact for making and breaking one side of the power source for the tool motor;

(b) a second pair of contacts including a second fixed contact and an associated second movable contact for making and breaking the other side of the power source to the tool motor;

(c) means connecting said trigger with said first and second movable contacts for closing said first and second pair of contacts sequentially such that the first pair of contacts is closed prior to closing of the second pair of contacts in response to movement of the trigger from its extended position to its depressed position and for opening said pairs of contacts in reverse order in response to movement of the trigger from its depressed position to its extended position; and (d) one of said first fixed and movable contacts having a contact making face with a surface area substantially less than the surface area of the contact face of one of said second fixed and movable contacts.

8. The improvement according to claim 7 wherein said connecting means includes camming means for rapidly making and breaking engagement of the second pair of contacts in a snap-action manner to minimize arcing.

9. The improvement according to claim 7 further defined by, a speed control circuit contained within the switch housing and including a variable resistor having a slider engaged with the trigger whereby the speed of a tool motor may be varied in response to the amount of movement of the trigger.

10. The improvement according to claim 9 further defined by:

(a) said speed control circuit including a controllable solid state element;

(b) a heat sink having a portion thereof adjacent said element for dissipating heat generated by the latter;

(c) said housing of the speed control switch having an opening in one of the walls thereof;

(d) said heat sink having a portion thereof in engagement with the inner surface of said wall adjacent and coextensive with said opening for exposing said heat sink to the ambient air for dissipation of heat.

11. The improvement according to claim 10 wherein said controllable solid state element is in direct physical contact with said heat sink.

12. The switch according to claim 9 wherein said speed control is provided on a circuit board and a heat sink is provided in intimate contact with said circuit board, said heat sink having a cooling fin attached thereto by a connecting element which doubles back on itself to position the fin directly behind the heat sink and spaced therefrom in a plane parallel to the plane of the heat sink.

13. In a double pole, trigger actuated switch of the type contained within a housing and adapted for mounting within the casing of a power tool for selectively connecting and disconnecting both sides of a power source for the tool motor in response to the movement of the trigger between extended and depressed positions, the improvements comprising:

(a) a first pair of contacts including a first fixed contact and an associated first movable contact for making and breaking one side of the power source for the tool motor;

(b) a second pair of contacts including a second fixed contact and an associated second movable contact for making and breaking the other side of the power source for the tool motor;

(c) means connecting said trigger with said first and second movable contacts for closing said first and second pairs of contacts;

(d) a speed control circuit contained within the switch housing on a circuit board operatively connected to the trigger whereby the speed of the tool motor may be varied in response to the amount of trigger movement; and (e) a heat sink contained within said housing and having a first planar portion in intimate contact with said circuit board and a second integral planar portion in parallel and closely spaced relation with a wall of the switch housing.

14. The trigger actuated switch according to claim 13 wherein said wall of the housing is provided with an opening for dissipating heat from said second planar portion of said heat sink.

* * * * *